US012701993B2

(12) United States Patent
Tu et al.

(10) Patent No.: US 12,701,993 B2
(45) Date of Patent: Aug. 4, 2026

(54) SEMICONDUCTOR STRUCTURES AND METHODS OF FORMING THE SAME

(71) Applicant: Taiwan Semiconductor Manufacturing Company, Ltd., Hsin-Chu (TW)

(72) Inventors: Wen-Chiung Tu, New Taipei City (TW); Dian-Hau Chen, Hsinchu (TW); Chen-Chiu Huang, Taichung City (TW); Hsiang-Ku Shen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 519 days.

(21) Appl. No.: 18/194,224

(22) Filed: Mar. 31, 2023

(65) Prior Publication Data

US 2024/0113011 A1     Apr. 4, 2024

Related U.S. Application Data

(60) Provisional application No. 63/411,227, filed on Sep. 29, 2022.

(51) Int. Cl.
H10W 20/40 (2026.01)
H10W 20/00 (2026.01)
(Continued)

(52) U.S. Cl.
CPC ....... H10W 20/496 (2026.01); H10W 20/056 (2026.01); H10W 20/062 (2026.01);
(Continued)

(58) Field of Classification Search
CPC ............. H01L 23/5223; H01L 23/5226; H01L 23/5283; H01L 21/76805; H01L 21/76877;
(Continued)

(56) References Cited

U.S. PATENT DOCUMENTS 10,861,810 B2    12/2020  Huang et al.
2010/0018576 A1*    1/2010  Kim ...................... H10F 77/703
136/256

(Continued)

FOREIGN PATENT DOCUMENTS

TW          202101775 A      1/2021

*Primary Examiner* — John M Parker
(74) *Attorney, Agent, or Firm* — HAYNES AND BOONE, LLP

(57) ABSTRACT

Semiconductor structures and methods are provided. An exemplary method includes forming a first conductive feature in a dielectric layer, forming a metal-insulator-metal (MIM) capacitor over the dielectric layer, forming a first passivation structure over the MIM capacitor, forming a first contact via opening extending through the first passivation structure and the MIM capacitor to expose the first conductive feature, depositing a conductive material to fill the first contact via opening, performing a first etching process to the conductive material to form a first metal feature, the first metal feature comprising a first portion filling the first contact via opening and a second portion over the first passivation structure, and performing a second etching process to trim the second portion of the first metal feature, after the second etching process, a shape of a cross-sectional view of the second portion of the first metal feature comprises a barrel shape.

20 Claims, 18 Drawing Sheets

(51) Int. Cl.
    *H10W 20/41*         (2026.01)
    *H10W 20/42*         (2026.01)

(52) U.S. Cl.
    CPC ......... *H10W 20/083* (2026.01); *H10W 20/42*
                (2026.01); *H10W 20/435* (2026.01)

(58) Field of Classification Search
    CPC .. H01L 21/7684; H01L 24/06; H10W 20/496;
             H10W 20/083; H10W 20/42; H10W
             20/056; H10W 20/062; H10W 20/435
    See application file for complete search history.

(56) References Cited

U.S. PATENT DOCUMENTS

| | | | |
|---|---|---|---|
| 2015/0170916 A1* | 6/2015 | Yu ..................... | H01L 21/02639 |
| | | | 438/493 |
| 2020/0006183 A1* | 1/2020 | Huang ............. | H01L 21/76885 |
| 2020/0035596 A1* | 1/2020 | Kao ................. | H01L 21/02554 |
| 2020/0119002 A1* | 4/2020 | Xie ........................ | H10D 30/62 |
| 2022/0375877 A1 | 11/2022 | Tai et al. | |

* cited by examiner

Figure 1:
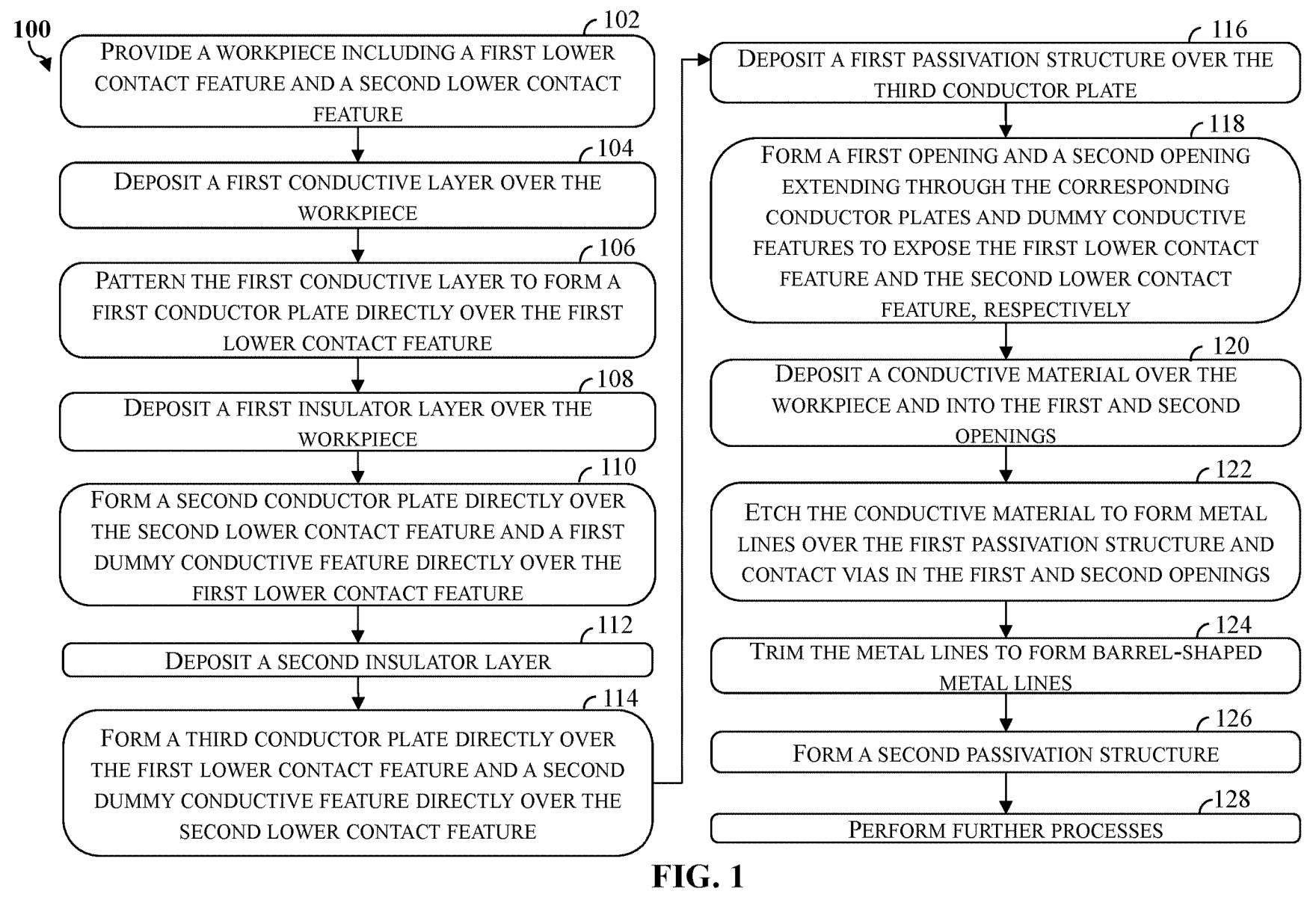

100

102 — PROVIDE A WORKPIECE INCLUDING A FIRST LOWER CONTACT FEATURE AND A SECOND LOWER CONTACT FEATURE

104 — DEPOSIT A FIRST CONDUCTIVE LAYER OVER THE WORKPIECE

106 — PATTERN THE FIRST CONDUCTIVE LAYER TO FORM A FIRST CONDUCTOR PLATE DIRECTLY OVER THE FIRST LOWER CONTACT FEATURE

108 — DEPOSIT A FIRST INSULATOR LAYER OVER THE WORKPIECE

110 — FORM A SECOND CONDUCTOR PLATE DIRECTLY OVER THE SECOND LOWER CONTACT FEATURE AND A FIRST DUMMY CONDUCTIVE FEATURE DIRECTLY OVER THE FIRST LOWER CONTACT FEATURE

112 — DEPOSIT A SECOND INSULATOR LAYER

114 — FORM A THIRD CONDUCTOR PLATE DIRECTLY OVER THE FIRST LOWER CONTACT FEATURE AND A SECOND DUMMY CONDUCTIVE FEATURE DIRECTLY OVER THE SECOND LOWER CONTACT FEATURE

116 — DEPOSIT A FIRST PASSIVATION STRUCTURE OVER THE THIRD CONDUCTOR PLATE

118 — FORM A FIRST OPENING AND A SECOND OPENING EXTENDING THROUGH THE CORRESPONDING CONDUCTOR PLATES AND DUMMY CONDUCTIVE FEATURES TO EXPOSE THE FIRST LOWER CONTACT FEATURE AND THE SECOND LOWER CONTACT FEATURE, RESPECTIVELY

120 — DEPOSIT A CONDUCTIVE MATERIAL OVER THE WORKPIECE AND INTO THE FIRST AND SECOND OPENINGS

122 — ETCH THE CONDUCTIVE MATERIAL TO FORM METAL LINES OVER THE FIRST PASSIVATION STRUCTURE AND CONTACT VIAS IN THE FIRST AND SECOND OPENINGS

124 — TRIM THE METAL LINES TO FORM BARREL-SHAPED METAL LINES

126 — FORM A SECOND PASSIVATION STRUCTURE

128 — PERFORM FURTHER PROCESSES

SEMICONDUCTOR STRUCTURES AND METHODS OF FORMING THE SAME

PRIORITY

This application claims the priority of U.S. Provisional Application Ser. No. 63/411,227 filed Sep. 29, 2022, entitled "Novel Barrel-Shaped AP Profile To Prevent PASS Crack," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate. Each IC chip is further attached (such as by bonding) to a circuit board, such as a printed circuit board (PCB) in electronic products. A redistribution layer (RDL) of conductive features (e.g., metal lines, vias) may be formed to reroute bond connections from the edge to the center of the chip. A passivation structure is coupled to the RDL to protect the semiconductor surface from electrical and chemical contaminants. However, an IC chip may be bonded to a package substrate before the package substrate is bonded to a PCB. The IC chip and the package substrate have different coefficients of thermal expansion (CTEs). During or after fabrication processes, the IC chip and the package substrate may expand and contract differently, causing stress near metal lines and cracks in the passivation structure, which lead to device failure. Therefore, although existing metal lines (or conductive pads) and passivation structure and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow chart of a method for fabricating a semiconductor structure, according to various aspects of the present disclosure.

DETAILED DESCRIPTION

Figure 2:
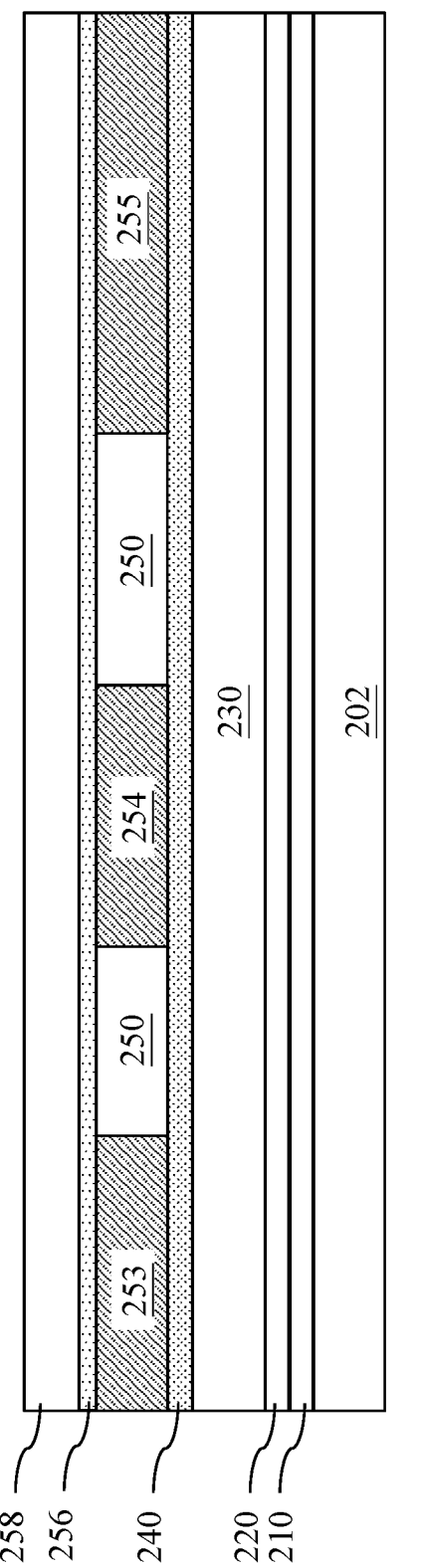
FIGS. 2, 3, 4, 5, 6, 7, 8, 9, 10, 11, 12, 13, 14, 15, 16, 17 and 18 are fragmentary cross-sectional views of a workpiece during various fabrication stages in the method of FIG. 1, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be+/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In some packaging technologies, a semiconductor chip (or IC chip) is bonded to a package substrate to form a semiconductor device package and the semiconductor device package is then bonded to a printed circuit board (PCB). The semiconductor chip and the package substrate haver different material properties. On the one hand, the semiconductor chip is formed primarily of semiconductor materials (such as silicon, germanium, silicon germanium, or III-V semiconductors), semiconductor oxide (such as silicon oxide), and semiconductor nitride (such as silicon nitride). The package substrate, on the other hand, may be a laminated substrate that includes polymeric materials and metals. For example, the package substrate may be fabricated from, for example, polyimide, a polymer composite laminate, an organic (laminate) material such as bismaleimide-triazine (BT), a polymer-based material such as liquid-crystal polymer (LCP), or the like. The package substrate may also include traces/lines that are formed from suitable conductive materials, such as copper, aluminum, silver, gold, other metals, alloys, combination thereof. As a result, a coefficient of thermal expansion (CTE) of the package substrate may be about greater than a CTE of the IC chip. The semiconductor device package may be subject to elevated temperature, for example, during solder reflow process. When the semiconductor device package is cooled down to room temperature, the package substrate may contract more than the IC chip. The deformation may exert stress on the IC chip, and the stress may concentrate near bottom and corners of the metal lines near the edge of the IC chip, causing cracks in the passivation structure and leading to device (e.g., metal-insulator-metal (MIM) capacitor under the passivation structure) failure.

The present disclosure provides a semiconductor structure having barrel-shape metal lines and methods of making the same to address these issues. In some embodiments, after forming metal-insulator-metal (MIM) capacitor, a first passivation structure is formed over the MIM capacitor. Contact via openings are then formed to penetrate through the first passivation structure to expose conductor plates of the MIM capacitor. A conductive material (including a single layer or multiple layers) may be then deposited over the MIM capacitor. In the present embodiment, a first etching process is performed to etch portions of the conductive material over the first passivation structure to form metal lines, and a second etching process is performed to trim lower portions of the metal lines, thereby forming metal lines having barrel-shaped profiles. Since the barrel-shape metal line can reduce stress buildup in certain areas, the barrel-shape metal line is thus less prone to cracks. As such, the resulting IC chip has better reliability and/or enhanced performance.

The various aspects of the present disclosure will now be described in more detail with reference to the figures. In that regard, FIG. 1 is a flowchart illustrating a method 100 for fabricating a semiconductor structure, according to embodiments of the present disclosure. Method 100 is described below in conjunction with FIGS. 2-18, which are fragmentary cross-sectional views of a workpiece at different stages of fabrication according to embodiments of method 100. Because the workpiece 200 will be fabricated into a semiconductor structure at the conclusion of the fabrication processes, the workpiece may also be referred to as a semiconductor structure 200, as the context requires. Method 100 is merely an example and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Additionally, throughout the present application, like reference numerals denote like features, unless otherwise excepted.

Referring to FIGS. 1 and 2, method 100 includes a block 102 where a workpiece 200 is provided. The workpiece 200 includes a substrate 202, which may be made of silicon or other semiconductor materials such as germanium. The substrate 202 may also include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Source/drain feature (s) may refer to a source or a drain, individually or collectively dependent upon the context. Transistors formed on the substrate 202 may be planar devices or multi-gate devices. Multi-gate devices include, for example, fin-like field effect transistors (FinFETs) or multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The workpiece 200 also includes a multi-layer interconnect (MLI) structure 210, which provides interconnections (e.g., wiring) between the various microelectronic components of the workpiece 200. The MLI structure 210 may also be referred to as an interconnect structure 210. The MLI structure 210 may include multiple metal layers or metallization layers. In some instances, the MLI structure 210 may include eight (8) to fourteen (14) metal layers. Each of the metal layers includes multiple conductive components embedded in an intermetal dielectric (IMD) layer. The conductive components may include contacts, vias, or metal lines. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, combinations thereof, or other suitable materials.

In an embodiment, a carbide layer 220 is deposited on the MLI structure 210. The deposition process includes chemical vapor deposition (CVD), physical vapor deposition (PVD), atomic layer deposition (ALD), or combinations thereof. Any suitable type of carbide material such as silicon carbide (SiC) can be used in the carbide layer 220.

In an embodiment, an oxide layer 230 is deposited on the carbide layer 220. Any suitable deposition process for the oxide layer 230 may be used, including CVD, flowable CVD (FCVD), spin-on coating, PVD, ALD, or combinations thereof. In an embodiment, the oxide layer 230 includes undoped silicon oxide.

The workpiece 200 also includes a first etch stop layer (ESL) 240 deposited on the oxide layer 230. The first ESL 240 may include silicon carbonitride (SiCN), silicon oxycarbide (SiOC), silicon carbide (SiC), silicon oxycarbonitride (SiOCN), or silicon nitride (SiN), or combinations thereof and may be formed by chemical vapor deposition (CVD), physical vapor deposition (PVD), atomic layer deposition (ALD), or combinations thereof.

The workpiece 200 also includes a dielectric layer 250 deposited on the first ESL 240. A composition of the dielectric layer 250 may be similar to that of the oxide layer 230. In some embodiments, the dielectric layer 250 includes undoped silica glass (USG) or silicon oxide. The dielectric layer 250 may be deposited using CVD, flowable CVD (FCVD), spin-on coating, PVD, ALD, or combinations thereof.

The workpiece 200 also includes a number of lower contact features (e.g., a lower contact feature 253, a lower contact feature 254, and a lower contact feature 255) formed in the dielectric layer 250. The formation of the lower contact features may include patterning of the dielectric layer 250 to form trenches and deposition of a barrier layer (not separately labeled) and a metal fill layer (not separately labeled) in the trenches. In some embodiments, the barrier layer may include titanium nitride or tantalum nitride and may be conformally deposited using PVD, CVD, metalorganic CVD (MOCVD), or a suitable method. In one embodiment, the barrier layer may include tantalum nitride. The metal fill layer may include copper (Cu) and may be deposited using electroplating or electroless plating. After the barrier layer and the metal fill layer are deposited, a planarization process, such as a chemical mechanical planarization (CMP) process, may be performed to remove excess barrier layer and metal fill layer to form the lower contact features 253, 254 and 255. Although the lower contact features 253, 254, and 255 are disposed below upper contact features (such as upper contact features 288M'), the lower contact features 253, 254, and 255 are sometimes referred to as top metal (TM) contacts.

The workpiece 200 also includes a second etch stop layer 256 formed directly on the dielectric layer 250. In an embodiment, the second etch stop layer 256 is deposited on the dielectric layer 250 by chemical vapor deposition (CVD), physical vapor deposition (PVD), atomic layer deposition (ALD), or combinations thereof. The second etch stop layer 256 may include silicon carbonitride (SiCN), silicon nitride (SiN), other suitable materials, or combinations thereof. In the present embodiments, the second etch stop layer 256 is in direct contact with top surfaces of the lower contact features 253, 254, and 255.

The workpiece 200 also includes an oxide layer 258 formed directly on the second etch stop layer 256. In an embodiment, the oxide layer 258 may include undoped silica glass (USG), silicon oxide, or other suitable material(s).

Figure 3:
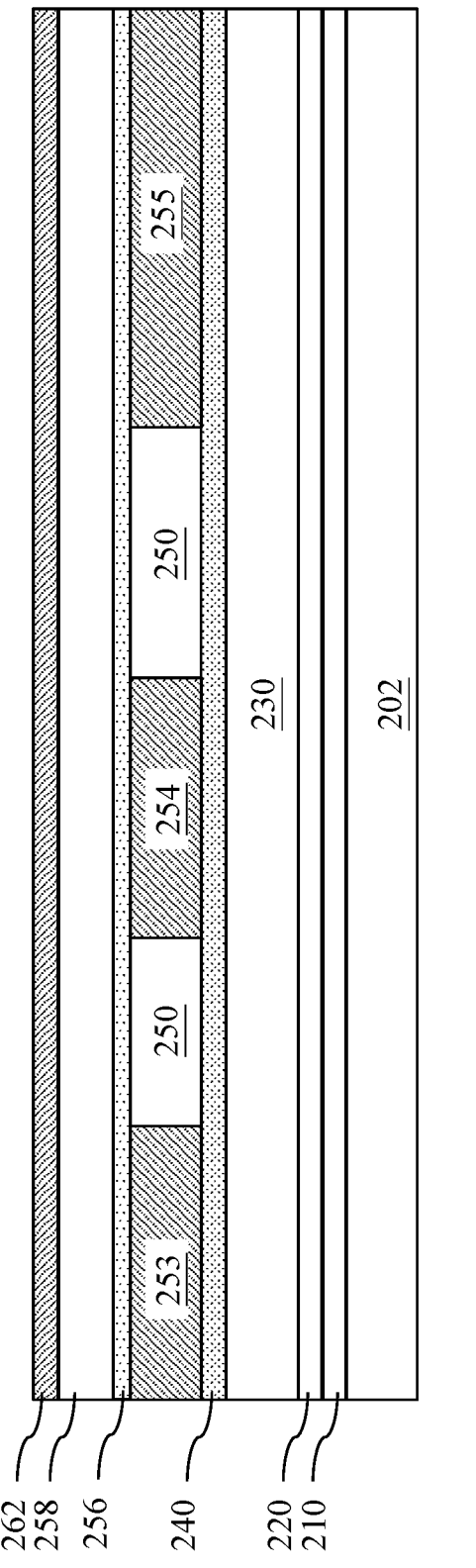

Referring to FIGS. 1 and 3, method 100 includes a block 104 where a first conductive layer 262 is formed directly on the oxide layer 258. The first conductive layer 262 may be deposited on the oxide layer 258 using PVD, CVD, or MOCVD. In some embodiments, the first conductive layer 262 may include titanium (Ti), tantalum (Ta), titanium nitride (TiN), tantalum nitride (TaN), copper (Cu), cobalt (Co), nickel (Ni), tungsten (W), aluminum (Al), or other suitable materials. The first conductive layer 262 may cover an entire top surface of the workpiece 200. In an embodiment, a deposition thickness of the first conductive layer 262 may be between about 40 nm and about 60 nm.

Figure 4:
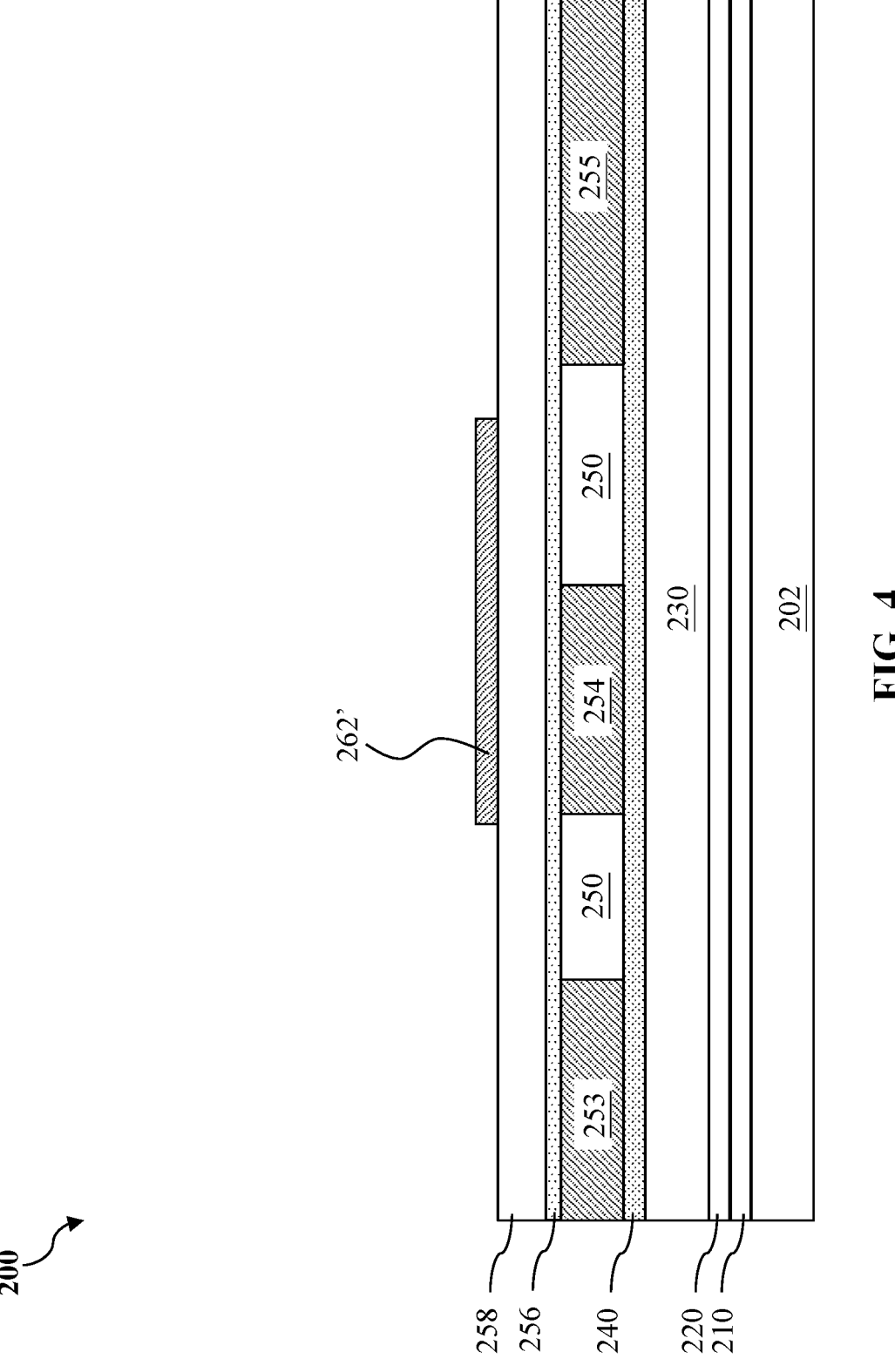

Referring to FIGS. 1 and 4, method 100 includes a block 106 where the first conductive layer 262 is patterned to form a first conductor plate 262' directly over the lower contact feature 254. The patterning may include deposition of a hard mask layer over the first conductive layer 262, formation of a photoresist layer over the hard mask layer, patterning of the photoresist layer using photolithography, etching of the hard mask layer using the patterned photoresist layer as an etch mask, and then etching of the first conductive layer 262 using the patterned hard mask as an etch mask. The hard mask layer and the photoresist layer may be selectively removed.

Figure 5:
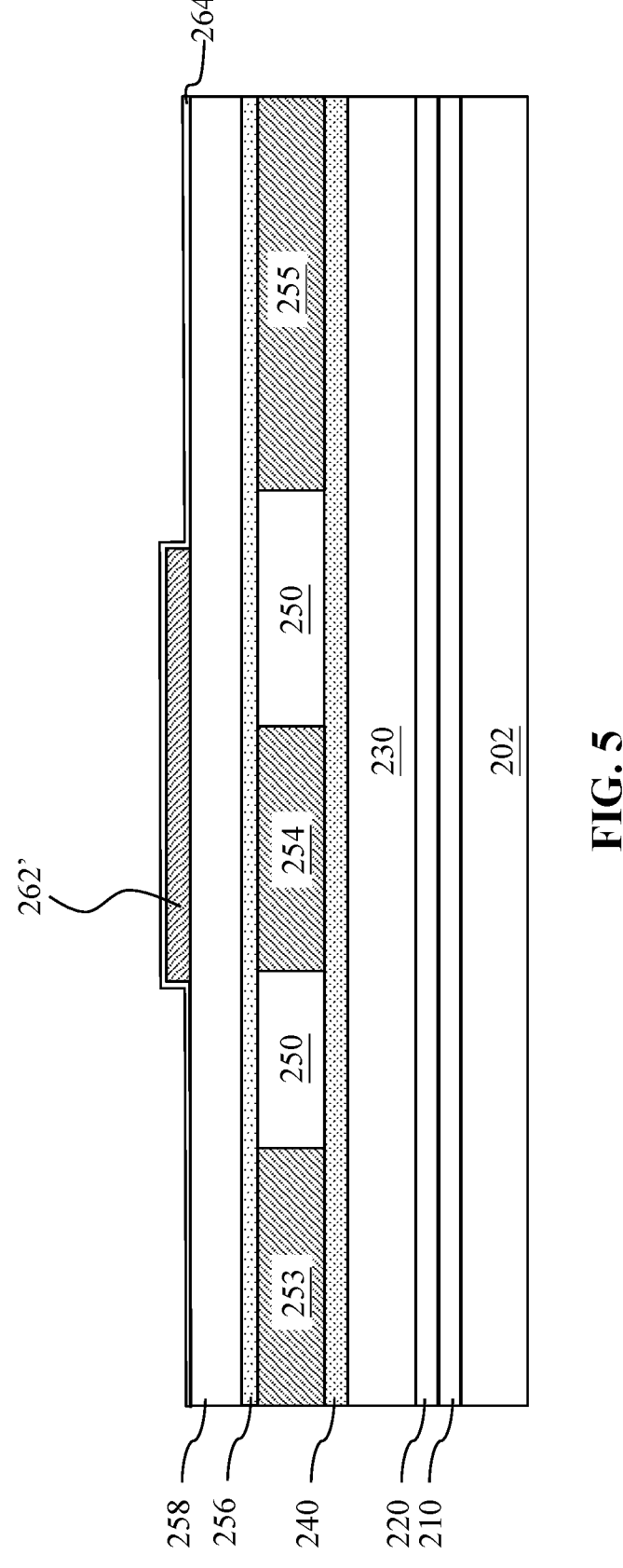

Referring to FIGS. 1 and 5, method 100 includes a block 108 where a first insulator layer 264 is deposited over the workpiece 200. As shown in FIG. 5, after the first conductive layer 262 is patterned to form the first conductor plate 262', the first insulator layer 264 is deposited. In an embodiment, the first insulator layer 264 is conformally deposited to have a generally uniform thickness over the top surface of the workpiece 200 (e.g., having about the same thickness on top and sidewall surfaces of the first conductor plate 262'). The first insulator layer 264 may be deposited using CVD, ALD, or a suitable deposition method and may be a high-k dielectric layer that includes hafnium oxide, aluminum oxide, zirconium oxide, titanium oxide, tantalum oxide, or a combination thereof.

Figure 6:
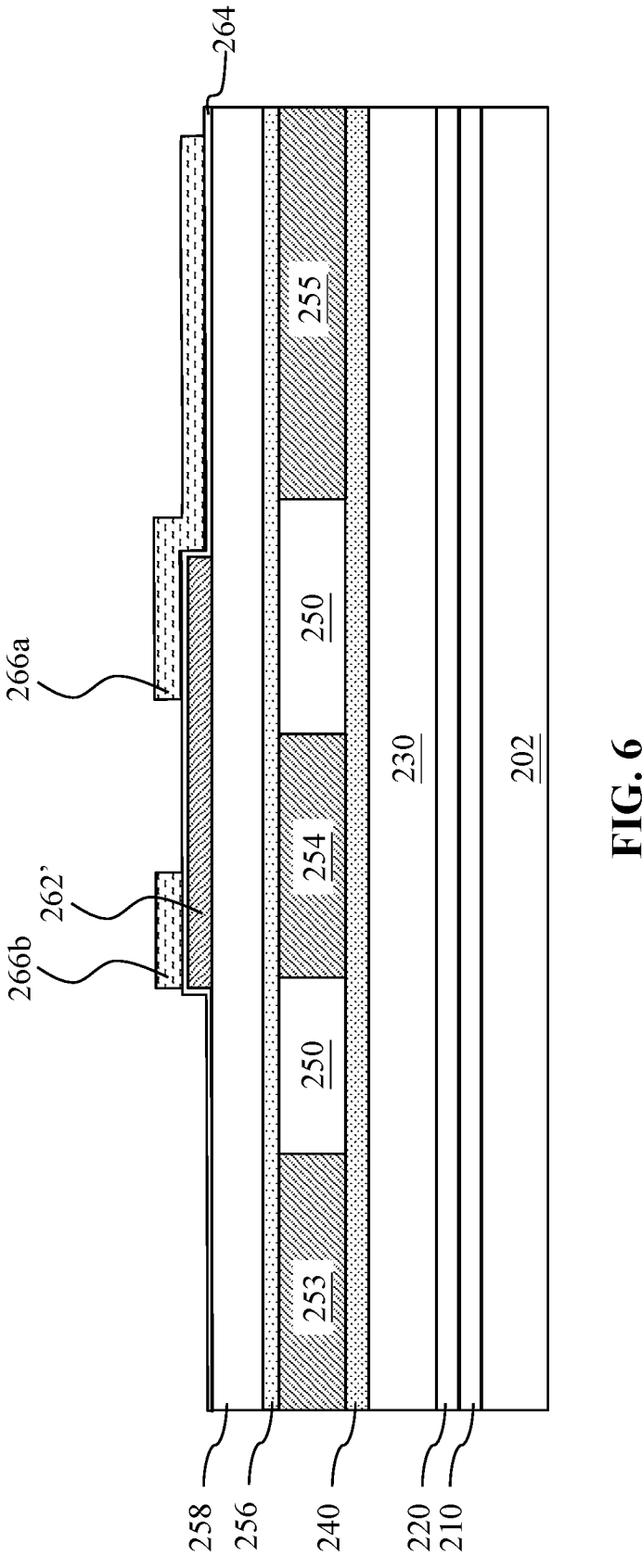

Referring to FIGS. 1 and 6, method 100 includes a block 110 where a second conductor plate 266a and a first dummy conductive feature 266b are formed on the first insulator layer 264. More specifically, the second conductor plate 266a is formed directly over the lower contact feature 255 and vertically overlapped with the first conductor plate 262', the first dummy conductive feature 266b is formed directly over the lower contact feature 254 and the first conductor plate 262'. The formation of the second conductor plate 266a and the first dummy conductive feature 266b may be similar to the formation of the first conductor plate 262'. For example, a second conductive layer may be deposited over the workpiece 200 and then patterned to form the second conductor plate 266a and the first dummy conductive feature 266b. In an embodiment, a thickness of the second conductor plate 266a may be between about 40 nm and about 60 nm.

Figure 7:
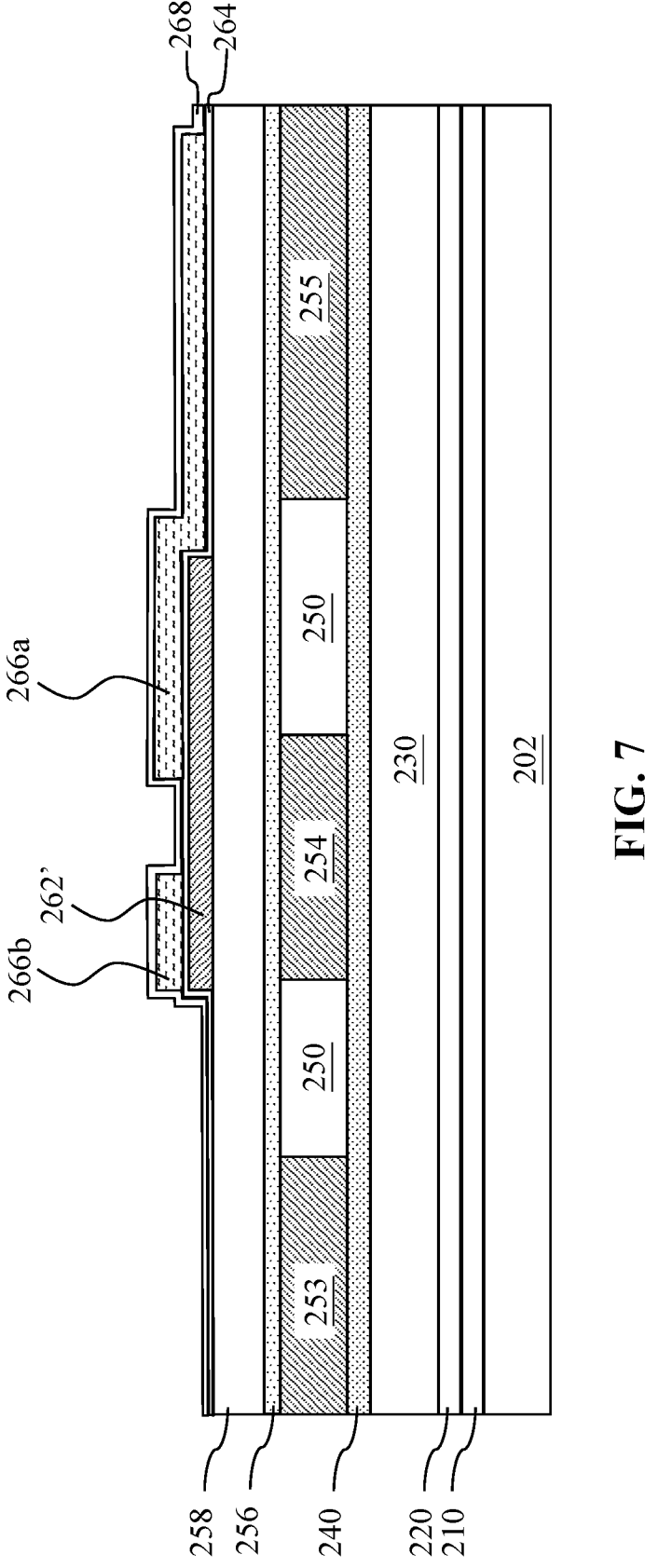

Referring to FIGS. 1 and 7, method 100 includes a block 112 where a second insulator layer 268 is formed over the workpiece 200. In an embodiment, the second insulator layer 268 is conformally deposited to have a generally uniform thickness over the top surface of the workpiece 200 (e.g., having about the same thickness on top and sidewall surfaces of the second conductor plate 266a). The formation and composition of the second insulator layer 268 may be similar to those of the first insulator layer 264 and repeated description is omitted for reason of simplicity.

Figure 8:
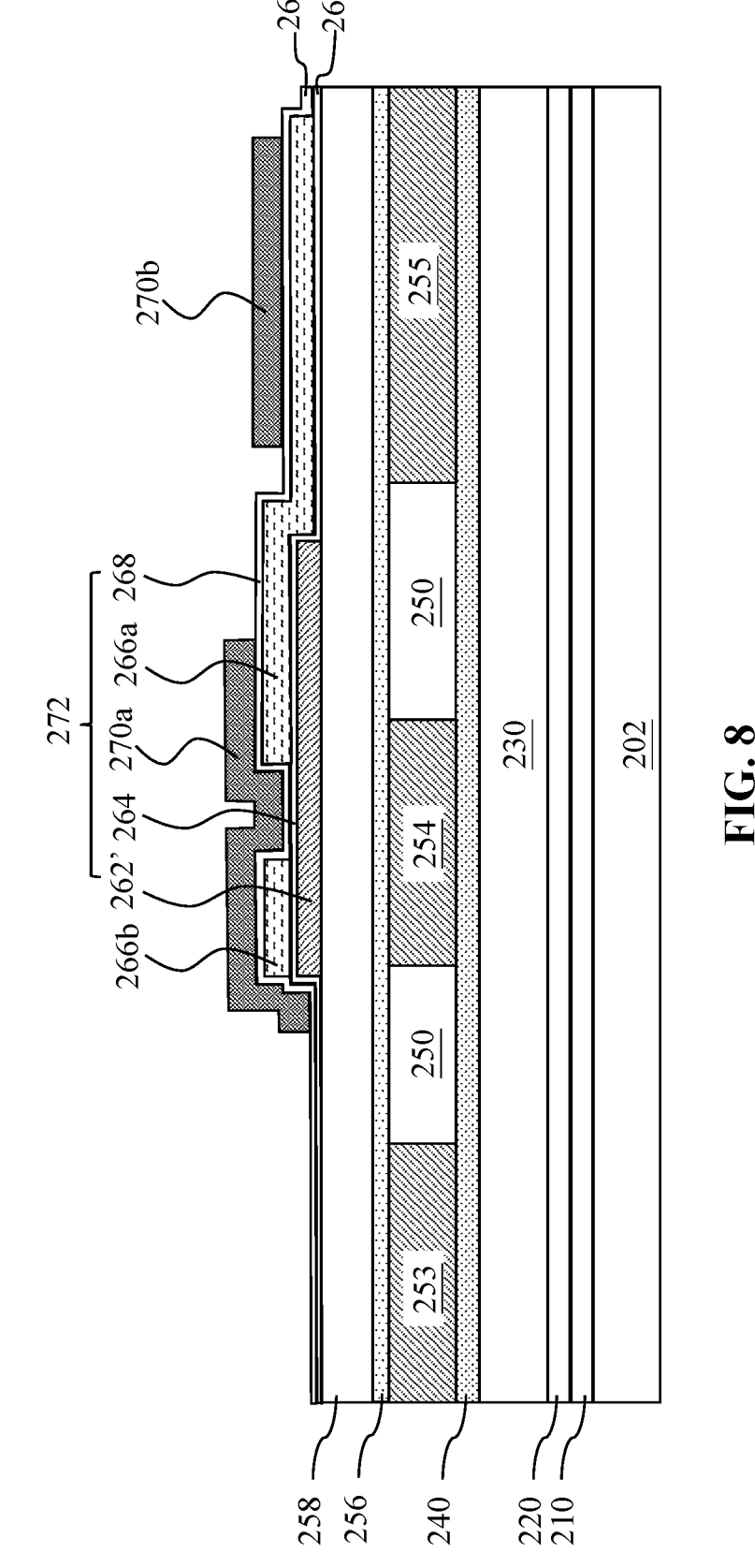

Referring to FIGS. 1 and 8, method 100 includes a block 114 where a third conductor plate 270a and a second dummy conductive feature 270b are formed on the second insulator layer 268. More specifically, the third conductor plate 270a is formed directly over the lower contact feature 254 and vertically overlapped with both the first conductor plate 262' and the second conductor plate 266a, and the second dummy conductive feature 270b is formed directly the lower contact feature 255 and vertically overlapped with the second conductor plate 266a. The formation and composition of the third conductor plate 270a and the second dummy conductive feature 270b may be similar to that of the first conductor plate 262', and repeated description is omitted for reason of simplicity.

After the formation of the third conductor plate 270a, the structure of a MIM capacitor 272 is finalized. In embodiments represented in FIG. 8, the workpiece 200 includes the MIM capacitor 272 and the first and second dummy conductive features 266b and 270b formed directly over the lower contact feature 254 and the lower contact feature 255. In the present embodiments, the MIM capacitor 272 includes three vertically stacked conductor plates (i.e., the first conductor plate 262', the second conductor plate 266a, and the third conductor plate 270a) and multiple insulator layers (i.e., the first insulator layer 264, the second insulator layer 268). It is understood that the MIM capacitor 272 may include other suitable number of conductor plates (e.g., four or more), and each two adjacent conductor plates are isolated by a corresponding insulator layer.

Figure 9:
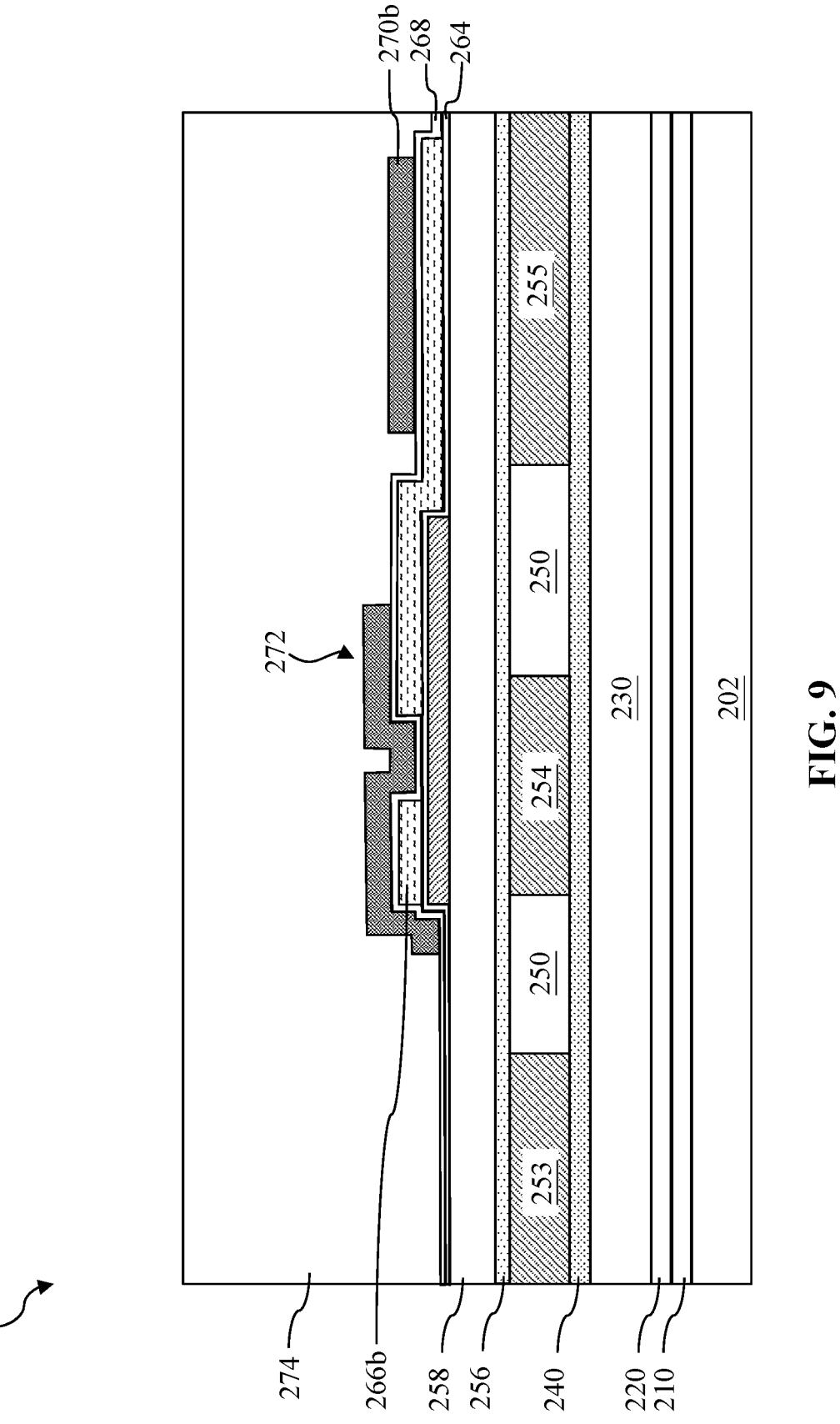

Referring to FIGS. 1 and 9, method 100 includes a block 116 where a first passivation structure 274 is formed over the MIM capacitor 272. As shown in FIG. 9, the MIM capacitor 272 is sandwiched between the first passivation structure 274 and oxide layer 258. In some embodiments, the first passivation structure 274 may include a dielectric layer or two or more dielectric layers formed by any suitable materials such as silicon oxide or silicon nitride. In an embodiment, the first passivation structure 274 includes silicon oxide formed by plasma-enhanced chemical vapor deposition (PECVD). A thickness of the first passivation structure 274 may be between about 5kA and 7kA.

Figure 10:
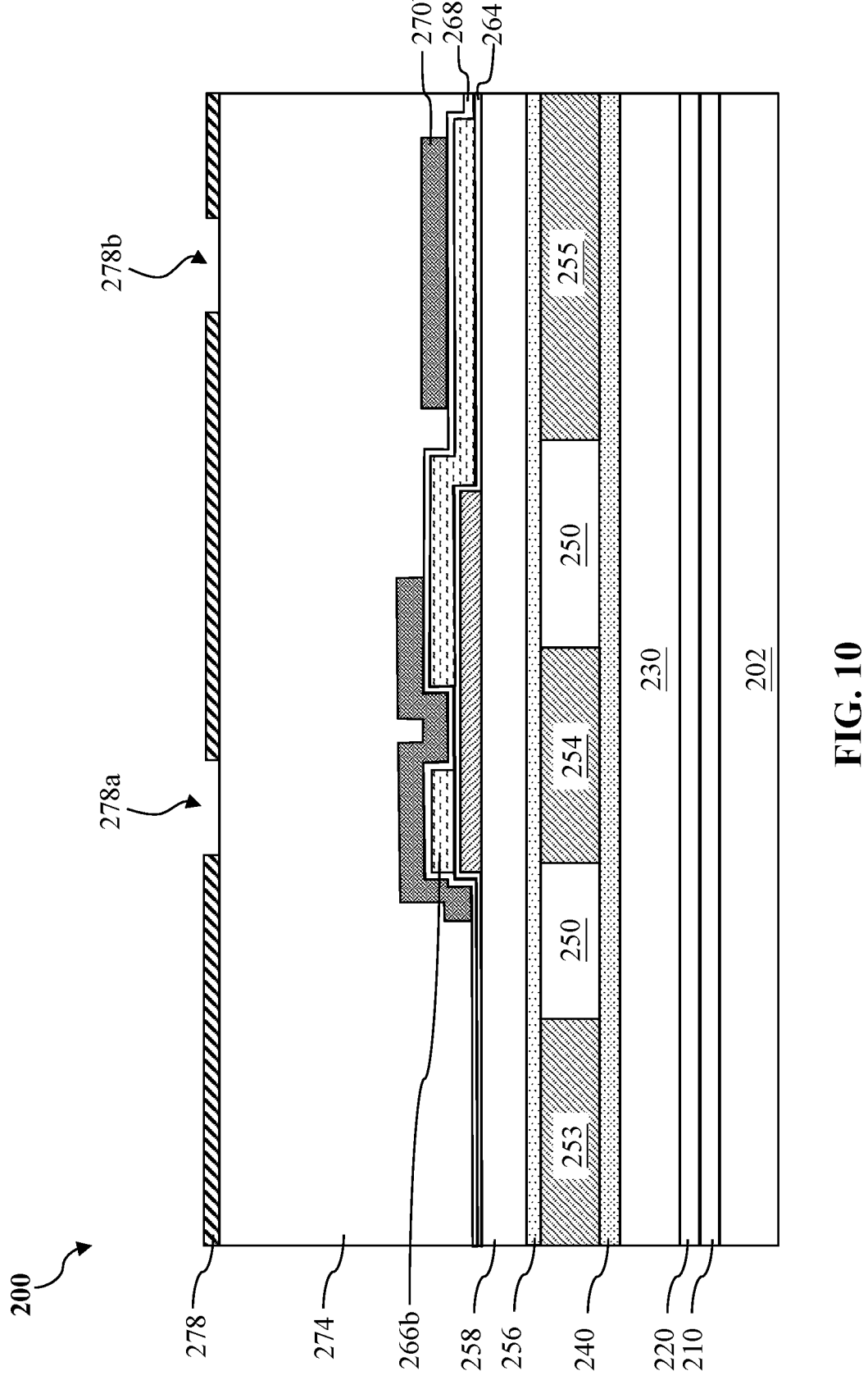

Referring to FIGS. 1, 10, 11 and 12, method 100 includes a block 118 where an opening 284 and an opening 286 are formed. After forming the first passivation structure 274, as shown in FIG. 10, a patterned mask film 278 is formed on the first passivation structure 274. The patterned mask film 278 includes two openings 278a and 278b exposing portions of the first passivation structure 274 thereunder. For example, the opening 278a exposes a portion of the first passivation structure 274 formed directly over the lower contact feature 254, the opening 278b exposes a portion of the first passivation structure 274 formed directly over the lower contact feature 255.

Figure 11:
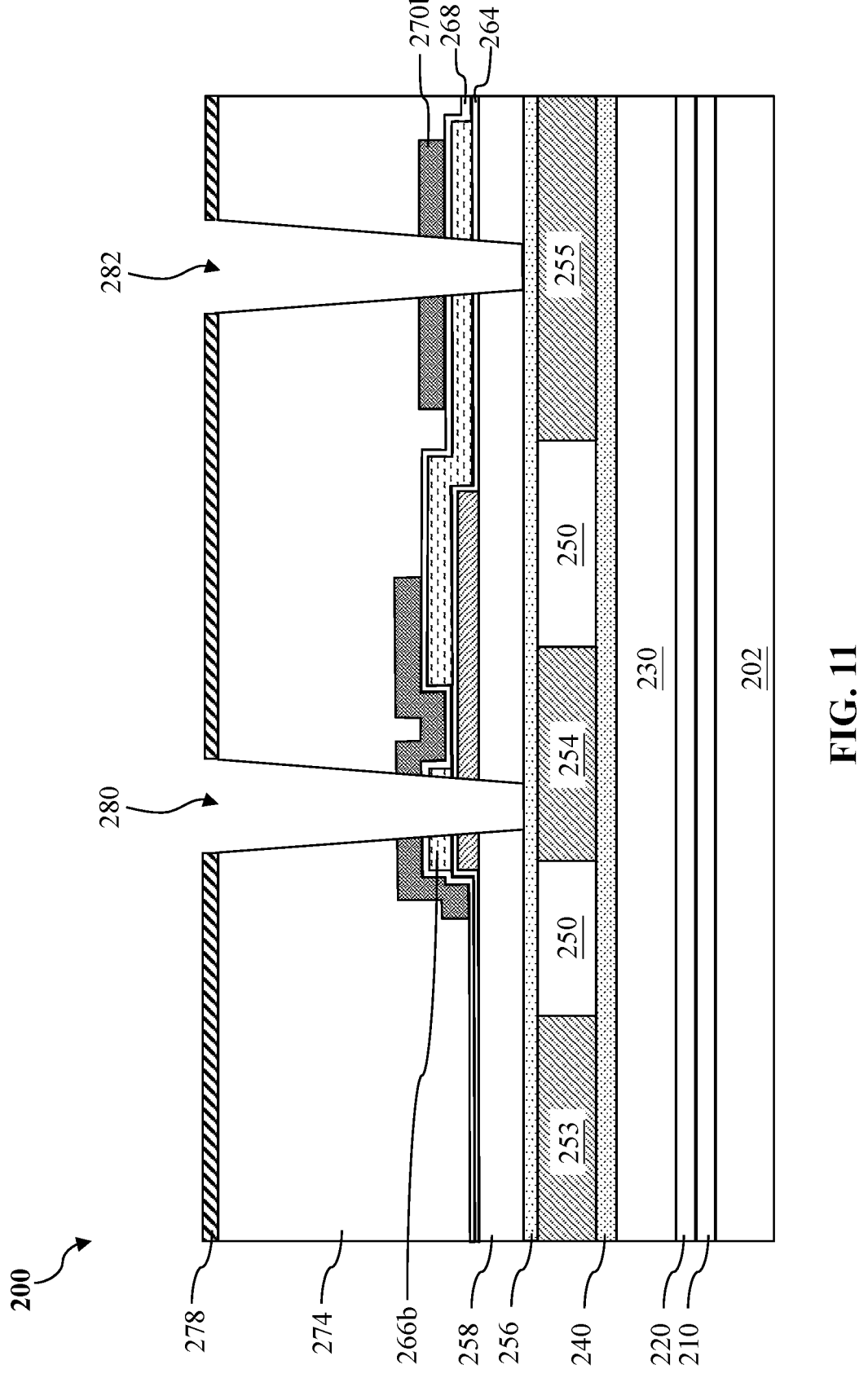

While using the patterned mask film 278 as an etch mask, an etching process may be performed to form an opening 280 and an opening 282, as represented in FIG. 11. In an embodiment, the etching process etches through the first passivation structure 274, the third conductor plate 270a, the second insulator layer 268, the first dummy conductive feature 266b, the first insulator layer 264, and the first conductor plate 262' to form the opening 280. The etching process further etches through the first passivation structure 274, the second dummy conductive feature 270b, the second insulator layer 268, the second conductor plate 266a, and the first insulator layer 264 to form the opening 282. In an embodiment, the etching process may include a dry etching process.

Figure 12:
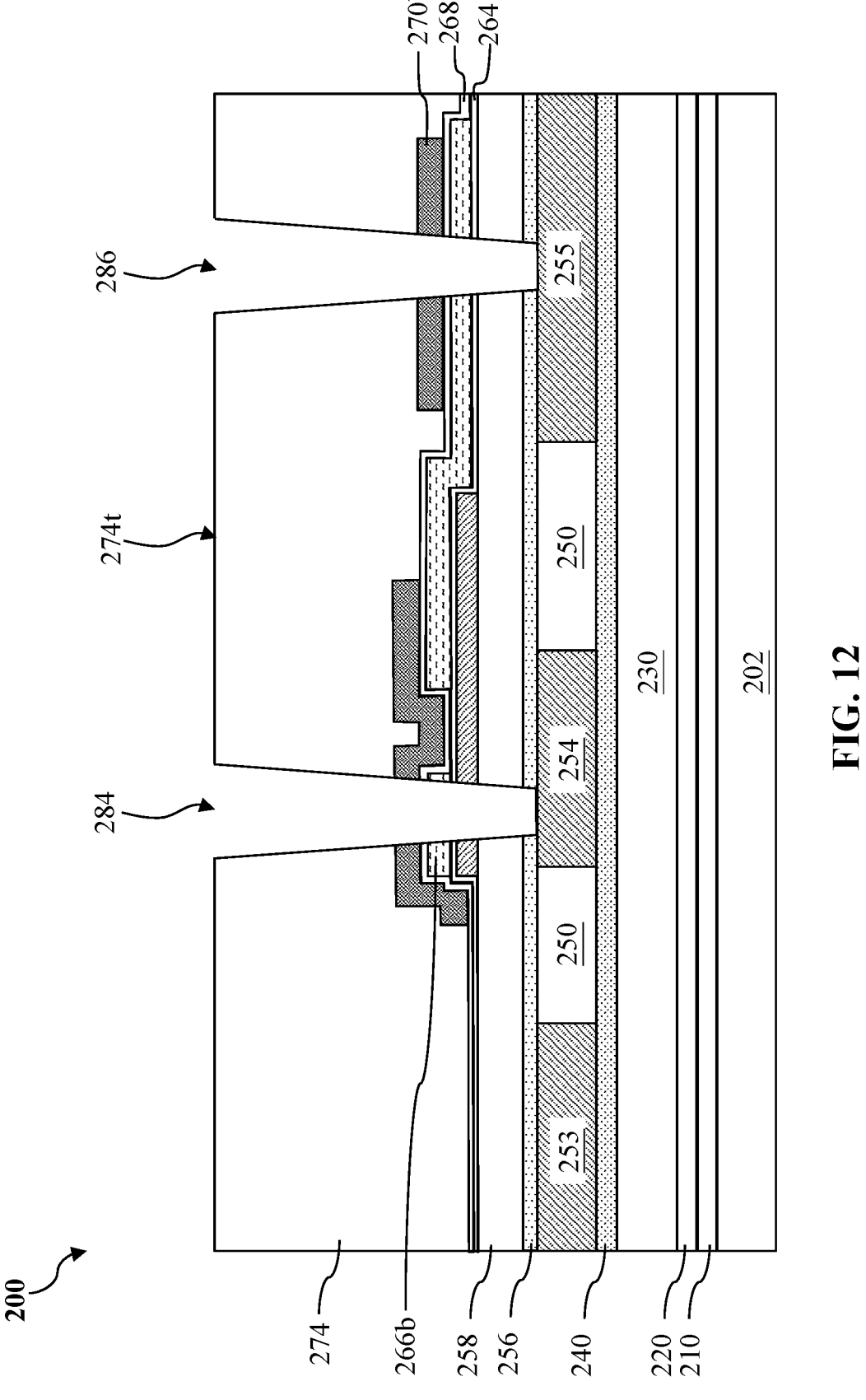

With reference to FIG. 12, after forming the opening 280 and the opening 282, another etching process is performed to vertically extend the opening 280 and the opening 282 to penetrate through the second etch stop layer 256 and expose the lower contact features 254 and 255. The vertically extended openings 280 and 282 may be referred to as opening 284 and opening 286, respectively. In some embodiments, a dry etching process may be used to selectively etch the second etch stop layer 256 to form the opening 284 and opening 286. After forming the opening 284 and opening 286, the patterned mask film 278 may be selectively removed to expose a top surface 274t of the first passivation structure 274.

Figure 13:
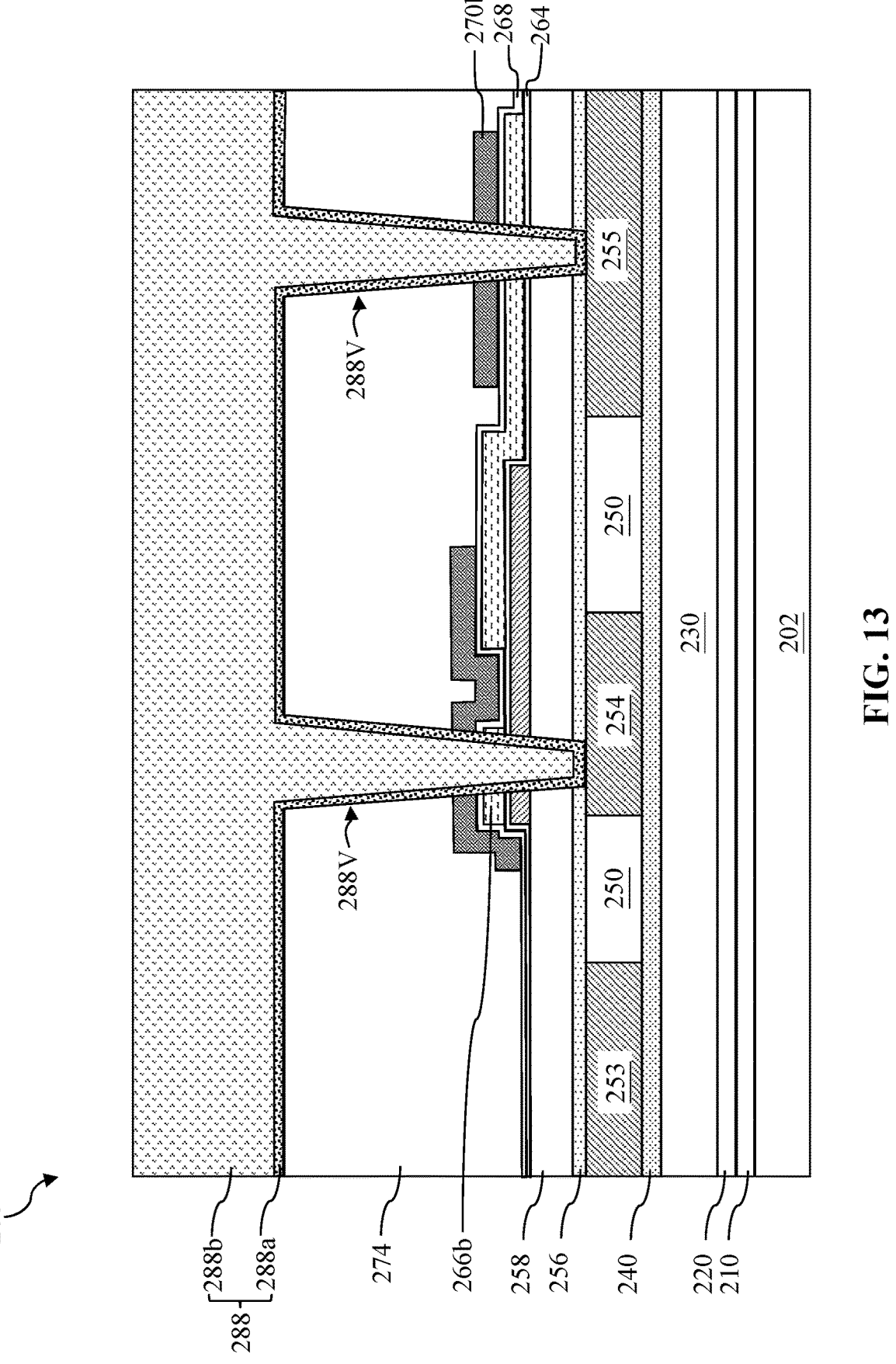

Referring to FIGS. 1 and 13, method 100 includes a block 120 where a conductive material 288 is deposited over the workpiece 200 and into the opening 284 and opening 286. In the present embodiment, the conductive material 288 includes a bi-layer structure. More specifically, to deposit the conductive material 288, a barrier layer 288a is first conformally deposited over the first passivation structure 274 and into the opening 284 and opening 286 using a suitable deposition technique, such as ALD, PVD or CVD and then a metal fill layer 288b is deposited over the barrier layer 288a using ALD, PVD, CVD, electroless plating, or electroplating. The barrier layer 288a may include titanium nitride (TiN), tantalum nitride (TaN), or another metal nitride. The metal fill layer 288b may be formed of copper (Cu), aluminum (Al), aluminum copper (Al—Cu), or other suitable materials. In an embodiment, the metal fill layer 288b includes aluminum copper (Al—Cu), the barrier layer 288a includes tantalum nitride (TaN). A planarization process (e.g., CMP) may be then performed after forming the metal fill layer 288b. Portions of the conductive material 288 formed in the openings 284 and 286 may be referred to as contact vias 288V. The contact via 288V tracks the shape of the opening 284/286.

Figure 14:
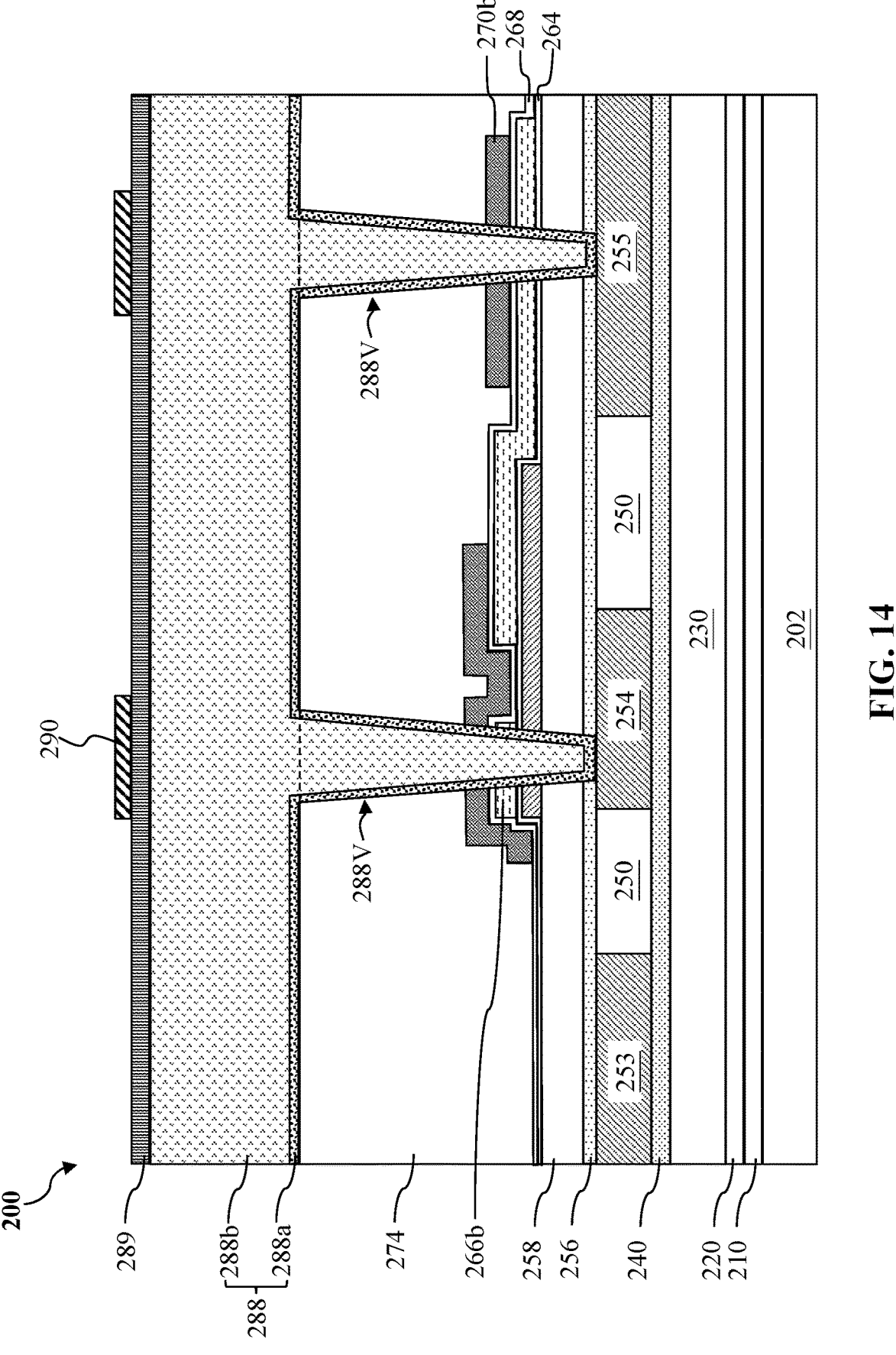
Figure 15:
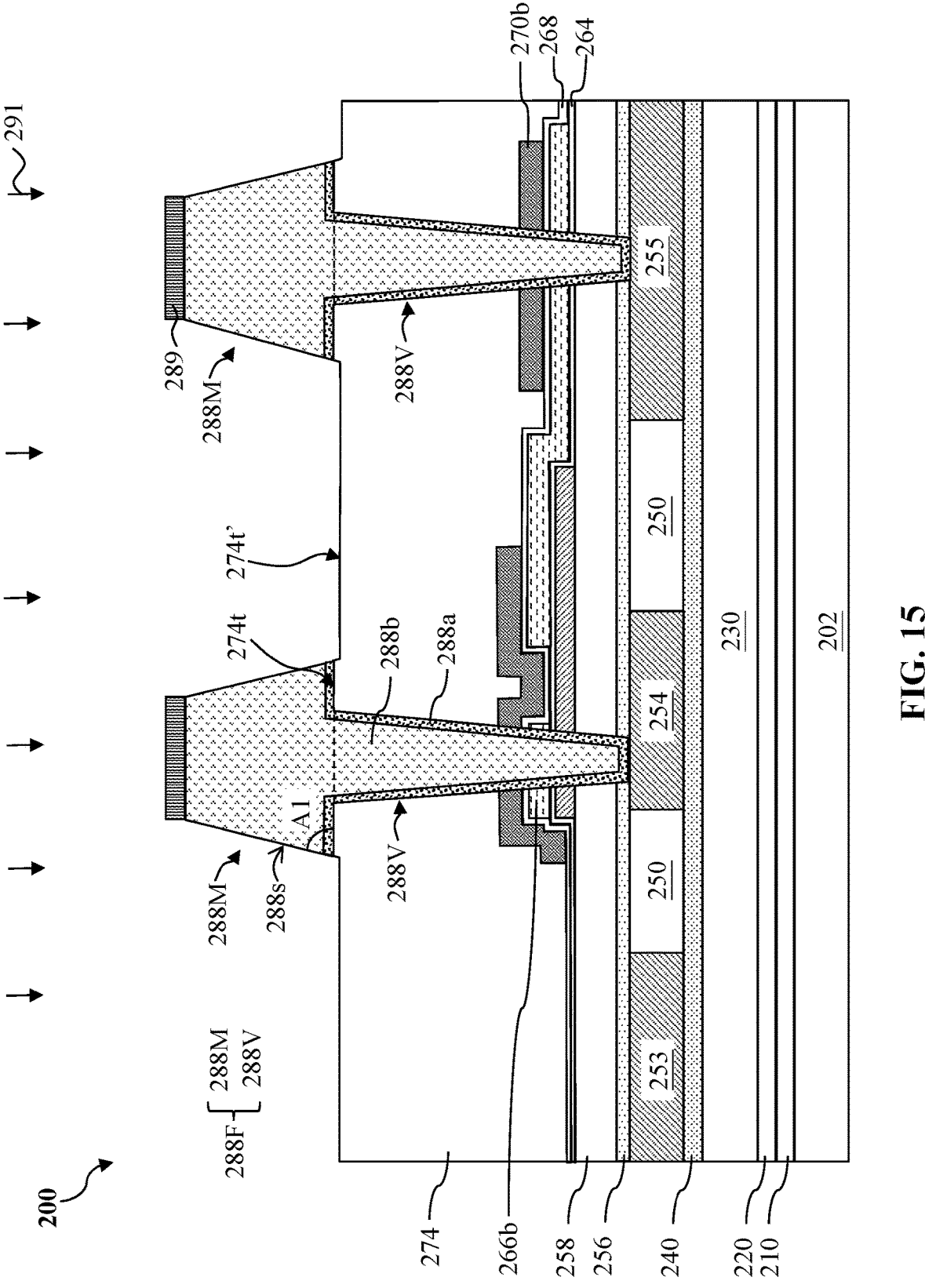

Referring to FIGS. 1, 14 and 15, method 100 includes a block 122 where the conductive material 288 is etched to form a number of metal lines 288M over the first passivation structure 274. With reference to FIG. 14, after forming the conductive material 288, an anti-reflective layer 289 is deposited over the conductive material 288 to improve photolithography process performance. In an embodiment, the anti-reflective layer 289 includes silicon oxynitride (SiON) formed by PECVD. A patterned photoresist layer 290 is then formed on the anti-reflective layer 289. The patterned photoresist layer 290 is vertically overlapped with the contact vias 288V. An etching process may be performed to the anti-reflective layer 289 using the patterned photoresist layer 290 as an etch mask.

With reference to FIG. 15, a first etching process 291 is then performed to etch a portion of the conductive material 288 over the top surface 274t of the first passivation structure 274 to form metal lines 288M. That is, a bottom surface of the metal line 288M is coplanar with the top surface 274t of the first passivation structure 274. It is noted that, the metal lines 288M and the contact vias 288V are formed from the same conductive material 288 and thus have same composition. It is understood that the contact via 288V and the metal line 288M are portions of an integral conductive feature 288F. In other words, the integral conductive feature 288F includes an upper portion (i.e., the metal line 288M) formed on the first passivation structure 274 and a lower portion (i.e., the contact via 288V) thereunder. The first etching process 291 may include a dry etch, a wet etch, or a combination thereof. The first etching process 291 may be tuned with various etching parameters, such as etchant used, etching temperature, etching solution concentration, etching pressure, source power, RF bias voltage, RF bias power, etchant flow rate, and/or other suitable parameters. In the present embodiments, the first etching process 291 includes a dry etch and implements etchant gases including a combination of chlorine ($Cl_2$) and boron trichloride ($BCl_3$). After the first etching process 291, as depicted in FIG. 15, in a cross-sectional view, the metal line 288M includes a trapezoidal shape. A sidewall surface 288s of the metal line 288M and the top surface 274t of the first passivation structure 274 form an angle A1, the angle A1 is an acute angle. In an embodiment, the angle A1 is between about 70° C. and about 85° C. The first etching process 291 further slightly recesses portions of the first passivation structure 274 not covered by the metal lines 288M. The recessed portion of the first passivation structure 274 includes a top surface 274t' that is lower than the top surface 274t of a remaining portion of the first passivation structure 274.

Figure 16:
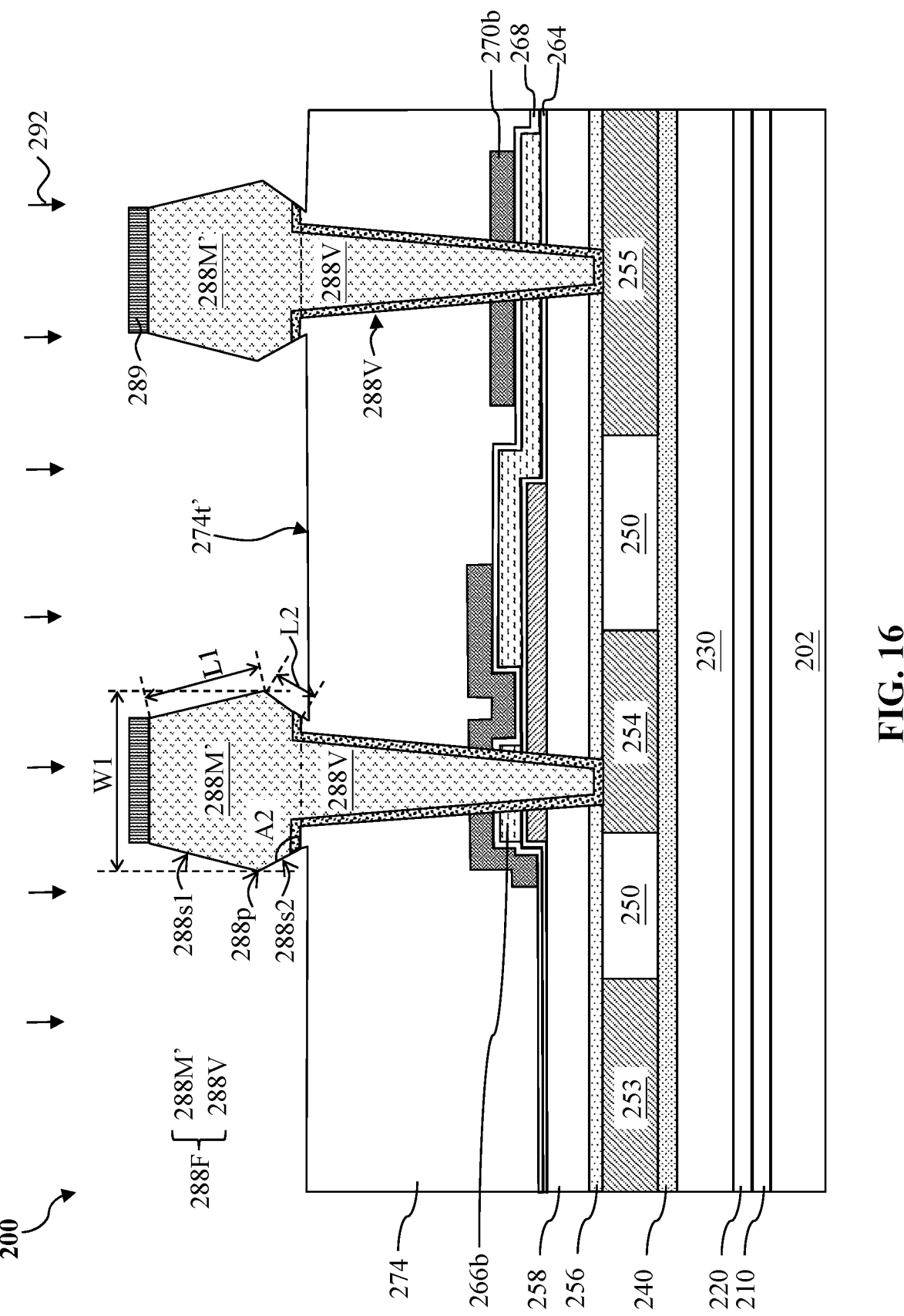

Referring to FIGS. 1 and 16, method 100 includes a block 124 where a second etching process 292 is performed to trim the conductive features 288F to form barrel-shape metal lines 288M' or hexagonal shape metal lines 288M'. More specifically, the second etching process 292 is configured to recess a lower portion of the metal lines 288M. The trimmed metal lines 288M may be referred to as metal lines 288M'. The second etching process 292 may include a dry etch, a wet etch, or a combination thereof. The second etching process 292 may be tuned with various etching parameters, such as etchant used, etching temperature, etching solution concentration, etching pressure, source power, RF bias voltage, RF bias power, etchant flow rate, and/or other suitable parameters. In an embodiment, the second etching process 292 includes a dry etch and implements etchant gases having a combination of chlorine ($Cl_2$) and boron trichloride ($BCl_3$). That is, the etchant gases of the second etching process 292 is the same as the etchant gases of the first etching process 291. A flow rate of the etchant gases of the second etching process 292 is less than a flow rate of the etchant gases of the first etching process 291, and a RF bias power of the second etching process 292 is less than a RF bias power of the etchant of the first etching process 291.

After the second etching process 292, as depicted in FIG. 16, in the cross-sectional view, the metal lines 288M' has a substantially barrel shape or a hexagonal shape. The barrel-shaped metal line 288M' would reduce stress concentrated at its corner and thus reduce cracks formed in the second passivation structure 299. A sidewall surface of the metal lines 288M' includes an upper portion 288s1 and a lower portion 288s2 intersecting the upper portion 288s1 at a vertex point 288p. The upper portion 288s1 may be a portion of the sidewall surface 288s of the untrimmed metal line 288M. After the second etching process 292, the lower portion 288s2 and the top surface 274t of the first passivation structure 274 form an angle A2. In the present embodiment, the angle A2 is an obtuse angle. The angle A2 may be between about 95° C. and about 115° C. The upper portion 288s1 may have a length L1, and the lower portion 288s2 may have a length L2. The length L1 may be greater than the length L2. The metal line 288M' spans a width W1. In an embodiment, in a cross-sectional view, the width W1 is equal to a distance between two vertex points 288p of two opposite sidewall surfaces of the metal lines 288M'. That is, the width W1 is greater than a width of a top surface of the metal line 288M' and is greater than a width of a bottom surface of the metal line 288M'. Although the upper portion 288s1 and the lower portion 288s2 of the sidewall surface of the metal line 288M' are illustrated to have straight edges, it is understood that the upper portion 288s1 and/or the lower portion 288s2 may have curved edges. In some embodiments, the metal lines 288M' may be referred to as upper contact features 288M' and may be part of a redistribution layer (RDL) to reroute bond connections between upper and lower layers.

Figure 17:
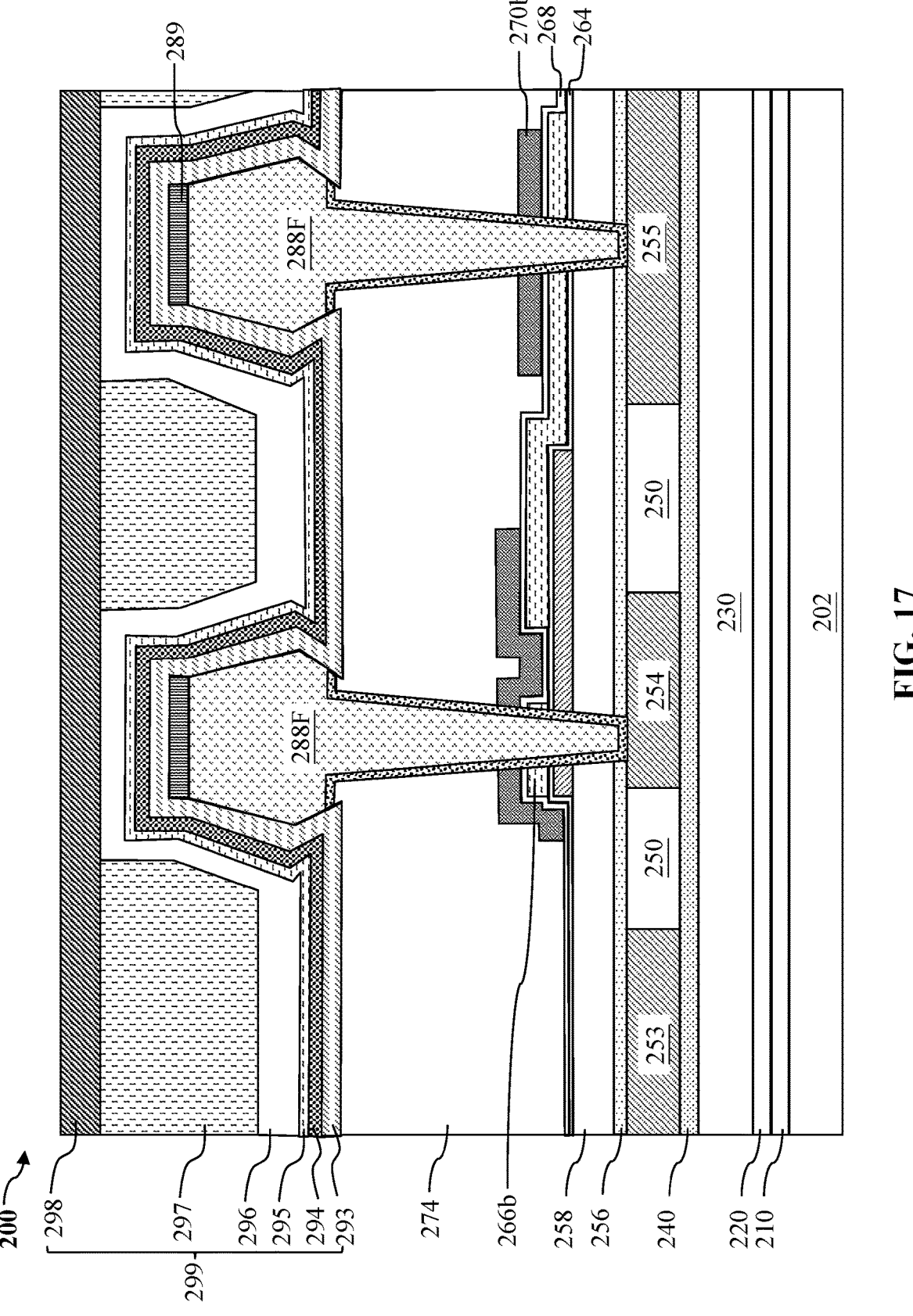

Referring to FIGS. 1 and 17, method 100 includes a block 126 where a second passivation structure 299 is formed over the workpiece 200. In the present embodiment, the second passivation structure 299 is a multi-layer structure formed over the upper contact features 288M' and over the first passivation structure 274. Forming the second passivation structure 299 involves multiple processes. With reference to FIG. 17, an oxide layer 293 is formed over the workpiece 200. The oxide layer 293 may include undoped silica glass (USG) or silicon oxide. The oxide layer 293 may be deposited using CVD, PVD, ALD, or combinations thereof. In an embodiment, the oxide layer 293 includes USG. A top surface of the upper contact features 288M' is in direct contact with the anti-reflective layer 289 and is spaced apart from the oxide layer 293 by the anti-reflective layer 289. At least a portion of the sidewall surface of the upper contact features 288M' is in direct contact with the oxide layer 293. After forming the oxide layer 293, a nitride layer (e.g., SiN) 294 is formed over the oxide layer 293. The nitride layer 294 may be formed using suitable methods such as CVD or ALD. In an embodiment, the nitride layer 294 is deposited to have a generally uniform thickness over the top surface of the oxide layer 293 (e.g., having about the same thickness over top and sidewall surfaces of the upper contact features 288M'). In some embodiments, a thickness of the nitride layer 294 may be between about 100 nm and about 200 nm. A thickness of the oxide layer 293 is greater than the thickness of the nitride layer 294. After forming the nitride layer 294, an oxide liner 295 is formed on the nitride layer 294. The oxide liner 295 may be formed using suitable methods such as CVD or ALD. In an embodiment, the oxide liner 295 is deposited to have a generally uniform thickness over the top surface of the nitride layer 294. A thickness of the oxide liner 295 is less than the thickness of the nitride layer 294. An oxide layer 296 is then formed over the oxide liner 295. The oxide layer 296 may be formed using high-density plasma (HDP) deposition. In an embodiment, a thickness of a portion of the oxide liner 295 formed between two adjacent upper contact features 288M' is greater than a thickness of a remaining portion of the oxide layer 295. An oxide layer 297 is then formed over the workpiece 200 to fill space between two adjacent upper contact features 288M'. In an embodiment, the oxide layer 297 may include silica glass (USG) or silicon oxide and may be deposited using CVD, PVD, ALD. A planarization process (e.g., CMP) may be performed to the workpiece 200 to provide a planar top surface. After the planarization process, a nitride layer 298 is formed over the oxide layer 297 and the oxide layer 296. The nitride layer 298 may be formed using suitable methods such as CVD or PVD. In an embodiment, the nitride layer 298 is deposited to have a generally uniform thickness over the top surface of the workpiece 200. In some embodiments, a thickness of the nitride layer 298 is greater than a thickness of the oxide layer 293. After formation, the second passivation structure 299 has six layers including, from bottom to top, the oxide layer 293, the nitride layer 294, the oxide liner 295, the oxide layer 296, the oxide layer 297, and the nitride layer 298.

Figure 18:
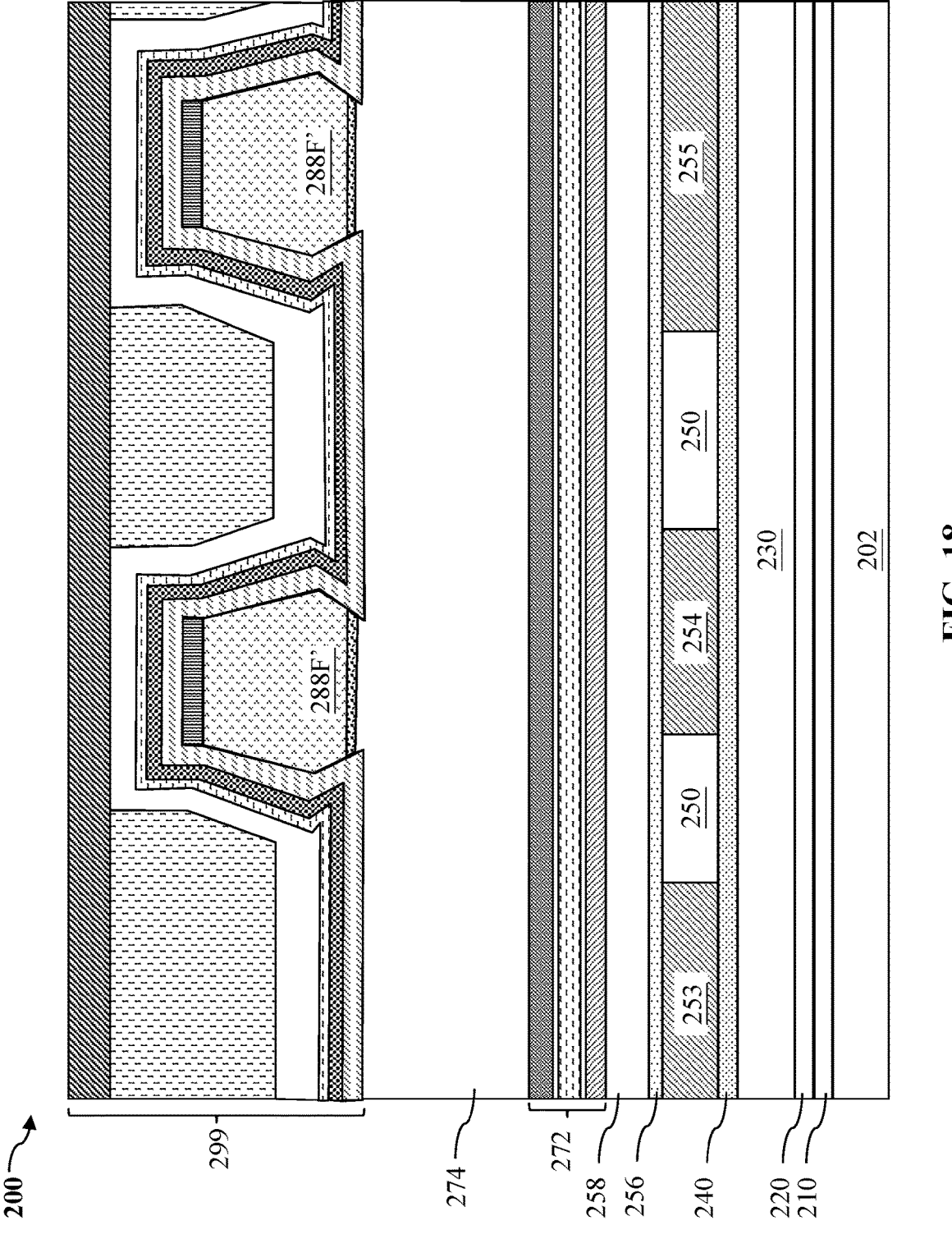

FIG. 18 depicts a fragmentary cross-sectional view of another portion of the workpiece 200. In an IC chip, some metal lines 288F' are used for routing and may not be electrically connected to devices (e.g., MIM capacitor 272) formed under the first passivation structure 274. In the present embodiment, the metal lines 288F' is electrically isolated from the MIM capacitor 272. A shape of the metal line 288F' includes a barrel shape, and the formation of the barrel-shaped metal line 288F' may be similar to the formation of the metal line 288M'.

Referring to FIG. 1, method 100 includes a block 128 where further processes are performed. Such further processes may include formation of openings extending through the second passivation structure 299 to expose the upper contact features 288M' and forming bonding pad(s) in the openings to electrically connect to the upper contact features 288M'. The bonding pad may include multiple layers, and its formation involves multiple processes. In some embodiments, after the opening is first created to expose the upper contact features 288M', an under-bump metal (UBM) layer may be deposited into the opening, and then a bump layer (e.g., made of copper) is deposited on the UBM layer. A solder layer may be then formed on the bump layer as a point of connection to external circuitry.

Although not intended to be limiting, one or more embodiments of the present disclosure provide many benefits to a semiconductor structure and the formation thereof. For example, the present disclosure provides barrel-shaped metal lines. In the present embodiments, by barrel-shaped metal lines, stress that would be concentrated at the metal lines may be reduced, and cracks that may be caused by the stress would be advantages reduced, thereby improving the overall performance and reliability of the semiconductor structure and the IC chip.

The present disclosure provides for many different embodiments. Semiconductor structures and methods of fabrication thereof are disclosed herein. In one exemplary aspect, the present disclosure is directed to a method. The method includes receiving a workpiece including a first conductive feature embedded in a dielectric layer, forming a metal-insulator-metal (MIM) capacitor over the dielectric layer, forming a first passivation structure over the MIM capacitor, forming a first contact via opening extending through the first passivation structure and the MIM capacitor to expose the first conductive feature, depositing a conductive material over the workpiece to fill the first contact via opening, performing a first etching process to the conductive material to form a first metal feature, the first metal feature comprising a first portion filling the first contact via opening and a second portion over the first passivation structure, and performing a second etching process to trim the second portion of the first metal feature, and after the second etching process, a shape of a cross-sectional view of the second portion of the first metal feature comprises a barrel shape.

In some embodiments, a bias power of the first etching process may be different than a bias power of the second etching process. In some embodiments, the first etching process and the second etching process implement same etchant, and a flow rate of etchant of the first etching process may be different than a flow rate of etchant of the second etching process. In some embodiments, the second portion of the first metal feature may include a lower sidewall surface and an upper sidewall surface, and the lower sidewall surface and a top surface of the first passivation structure may form an obtuse angle. In some embodiments, the method may also include, before the depositing of the conductive material, conformally depositing a barrier layer over the workpiece, where the first portion of first metal feature further may include a portion of the barrier layer extending along sidewall and bottom surfaces of a portion of the conducive material in the first contact via opening, and the second portion of the first metal feature further may include a portion of the barrier layer disposed on the first passivation structure. In some embodiments, the method may also include, after the performing of the second etching process, forming a second passivation structure over the first metal feature, where a composition of the second passivation structure may be different than a composition of the first passivation structure. In some embodiments, the method may also include, before the performing of the first etching process, depositing an anti-reflective layer on the conducive material, forming a patterned mask film on the anti-reflective layer, and patterning the anti-reflective layer using the patterned mask film as an etch mask, where a top surface of the first metal feature may be spaced apart from the second passivation structure by the anti-reflective layer. In some embodiments, the conducive material may include aluminum (Al) or aluminum copper (Al—Cu), and the anti-reflective layer may include silicon oxynitride (SiON). In some embodiments, the workpiece may also include a second conductive feature embedded in a dielectric layer, and the method may also include forming a second contact via opening extending through the first passivation structure and the MIM capacitor to expose the second conductive feature, and forming a second metal feature, where the second metal feature may include a first portion filling the second contact via opening and a second portion over the first passivation structure, and a shape of cross-sectional view of the second portion of the second metal feature may include a barrel shape.

In another exemplary aspect, the present disclosure is directed to a method. The method includes forming a metal-insulator-metal (MIM) capacitor over a substrate, forming a dielectric layer over the MIM capacitor, forming a conductive pad on the dielectric layer, and forming a passivation structure on the dielectric layer and the conductive pad, where a sidewall surface of the conductive pad includes a lower portion and an upper portion, the lower portion and a bottom surface of the conductive pad forms a first angle, and the upper portion and the bottom surface of the conductive pad forms a second angle, the first angle is different from the second angle, and the first angle is an obtuse angle.

In some embodiments, the forming of the conductive pad may include depositing a barrier layer on a top surface of the dielectric layer, depositing a conductive layer on the barrier layer, etching the conductive layer and the barrier layer to form a conductive feature over the MIM capacitor, and trimming a lower portion of the conductive feature to form the conductive pad. In some embodiments, the etching of the conductive layer and the barrier layer may include implementing an etchant under a first bias power, and the trimming of the lower portion of the conductive feature may include implementing the etchant under a second bias power, the first bias power may be different than the second bias power. In some embodiments, the forming of the conductive pad may include, after the depositing of the conductive layer, forming an anti-reflective layer on the conductive layer, forming a patterned mask film on the anti-reflective layer, patterning the anti-reflective layer using the patterned mask film as an etch mask, where the etching of the conductive layer and the barrier layer may use the patterned anti-reflective layer as an etch mask. In some embodiments, a top surface of the conductive pad may be spaced apart from the passivation structure by the patterned anti-reflective layer. In some embodiments, the forming of the passivation structure may include conformally depositing a first oxide layer over the conductive pad, conformally depositing a first nitride layer over the first oxide layer, forming an oxide liner over the first nitride layer, depositing a second oxide layer over the oxide liner, performing a planarization process to the second oxide layer, and forming a second nitride layer over the second oxide layer. In some embodiments, the second angle may be an acute angle.

In yet another exemplary aspect, the present disclosure is directed to a semiconductor structure. The semiconductor structure includes a lower contact feature in a dielectric layer, a metal-insulator-metal (MIM) capacitor disposed over the dielectric layer and comprising a vertical stack of conductor plates, a first passivation structure disposed over the MIM capacitor, a conductive feature electrically coupled to the lower contact feature, wherein the conductive feature comprises a first portion extending through the first passivation structure and a second portion over the first passivation structure, where, in a cross-sectional view, a shape of the second portion of the conductive feature comprises a substantially barrel shape.

In some embodiments, the conductive feature may include a barrier layer and a conductive fill layer disposed on the barrier layer, where the barrier layer comprises tantalum nitride (TaN), and the conductive fill layer may include aluminum (Al) or aluminum copper (Al—Cu). In some embodiments, a sidewall surface the second portion of the conductive feature may include an upper portion and a lower portion, an angle formed between the lower portion of the sidewall surface and a top surface of the first passivation structure may be between about 95° C. and about 115° C. In some embodiments, the semiconductor structure may also include an anti-reflective layer formed on a top surface of the conductive feature, and a second passivation structure formed on the first passivation structure and the anti-reflective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a workpiece including a first conductive feature embedded in a dielectric layer;
forming a metal-insulator-metal (MIM) capacitor over the dielectric layer;
forming a first passivation structure over the MIM capacitor;
forming a first contact via opening extending through the first passivation structure and the MIM capacitor to expose the first conductive feature;
depositing a conductive material layer over the workpiece to fill the first contact via opening;
performing a first etching process to the conductive material layer to form a first metal feature, the first metal feature comprising a first portion filling the first contact via opening and a second portion over the first passivation structure, wherein a width of the second portion of the first metal feature gradually increases along a direction from a top surface of the first metal feature towards a bottom surface of the first metal feature; and
performing a second etching process to trim the second portion of the first metal feature, wherein, after the second etching process, in a cross-sectional view, a shape of the second portion of the first metal feature comprises a barrel shape.

2. The method of claim 1, wherein a bias power of the first etching process is different than a bias power of the second etching process.

3. The method of claim 1, wherein the first etching process and the second etching process implement a same etchant, and a flow rate of the etchant of the first etching process is different than a flow rate of the etchant of the second etching process.

4. The method of claim 1, wherein the second portion of the first metal feature comprises a lower sidewall surface and an upper sidewall surface, and the lower sidewall surface and a top surface of the first passivation structure forms an obtuse angle.

5. The method of claim 1, further comprising:
before the depositing of the conductive material layer, conformally depositing a barrier layer over the workpiece, wherein the first portion of first metal feature further comprises a portion of the barrier layer in the first contact via opening, and the second portion of the first metal feature further comprises a portion of the barrier layer disposed on the first passivation structure.

6. The method of claim 1, further comprising:
after the performing of the second etching process, forming a second passivation structure over the first metal feature, wherein a composition of the second passivation structure is different than a composition of the first passivation structure.

7. The method of claim 6, further comprising:
before the performing of the first etching process, depositing an anti-reflective layer on the conducive material layer;
forming a patterned mask film on the anti-reflective layer; and
patterning the anti-reflective layer using the patterned mask film as an etch mask,
wherein the top surface of the first metal feature is spaced apart from the second passivation structure by the anti-reflective layer.

8. The method of claim 7, wherein the conducive material layer comprises aluminum (Al) or aluminum copper (Al-Cu), and the anti-reflective layer comprises silicon oxynitride (SiON).

9. The method of claim 1, wherein the workpiece further comprises a second conductive feature embedded in a dielectric layer, and the method further comprises:
forming a second contact via opening extending through the first passivation structure and the MIM capacitor to expose the second conductive feature; and
forming a second metal feature, wherein the second metal feature comprises a first portion filling the second contact via opening and a second portion over the first passivation structure, and a shape of cross-sectional view of the second portion of the second metal feature comprises a barrel shape.

10. A method, comprising:
forming a metal-insulator-metal (MIM) capacitor over a substrate;
forming a dielectric layer over the MIM capacitor;
forming a conductive pad over the dielectric layer, wherein a bottom surface of the conductive pad is above a topmost surface of the MIM capacitor; and
forming a passivation structure on the dielectric layer and the conductive pad,
wherein a sidewall surface of the conductive pad comprises a lower portion and an upper portion, the lower portion and the bottom surface of the conductive pad forms a first angle, and the upper portion and the bottom surface of the conductive pad forms a second angle, wherein the first angle is different from the second angle, and the first angle is an obtuse angle.

11. The method of claim 10, wherein the forming of the conductive pad comprises:
depositing a barrier layer on a top surface of the dielectric layer;
depositing a conductive layer on the barrier layer;
etching the conductive layer and the barrier layer to form a conductive feature over the MIM capacitor; and
trimming a lower portion of the conductive feature to form the conductive pad.

12. The method of claim 11, wherein the etching of the conductive layer and the barrier layer comprises implementing an etchant under a first bias power, and the trimming of the lower portion of the conductive feature comprises implementing the etchant under a second bias power, the first bias power is different than the second bias power.

13. The method of claim 11, wherein the forming of the conductive pad comprises:

after the depositing of the conductive layer, forming an anti-reflective layer on the conductive layer;

forming a patterned mask film on the anti-reflective layer;

patterning the anti-reflective layer using the patterned mask film as an etch mask;

wherein the etching of the conductive layer and the barrier layer uses the patterned anti-reflective layer as an etch mask.

14. The method of claim 13, wherein a top surface of the conductive pad is spaced apart from the passivation structure by the patterned anti-reflective layer.

15. The method of claim 10, wherein the forming of the passivation structure comprises:

conformally depositing a first oxide layer over the conductive pad;

conformally depositing a first nitride layer over the first oxide layer;

forming an oxide liner over the first nitride layer;

depositing a second oxide layer over the oxide liner;

performing a planarization process to the second oxide layer; and forming a second nitride layer over the second oxide layer.

16. The method of claim 10, wherein the second angle is an acute angle.

17. A method, comprising:

depositing a conductive material layer over a dielectric layer;

forming a patterned mask over the conductive material layer, the patterned mask extending over a first portion of the conductive material layer, wherein a second portion of the conductive material layer is not covered by the patterned mask;

performing a first etching process to partially remove the second portion of the conductive material layer, wherein, upon completion of the performing of the first etching process, the conductive material layer has a top surface, a bottom surface, and a sidewall surface connecting the top surface and the bottom surface, wherein the sidewall surface is a linear sidewall surface; and after the performing of the first etching process, performing a second etching process to trim a lower portion of the conductive material layer, wherein, upon completion of the performing of the second etching process, the sidewall surface of the conductive material layer becomes a non-linear sidewall surface.

18. The method of claim 17, wherein a bias power of the second etching process is less than a bias power of the first etching process.

19. The method of claim 17, wherein the first etching process and the second etching process implement a same etchant, and a flow rate of the etchant of the first etching process is greater than a flow rate of the etchant of the second etching process.

20. The method of claim 17, wherein, after the performing of the second etching process, the sidewall surface of the conductive material layer comprise a lower portion close to the dielectric layer and an upper portion away from the dielectric layer, and the lower portion and a topmost surface of the dielectric layer forms an obtuse angle.

* * * * *